United States Patent

Poinelli et al.

[11] Patent Number: 5,852,324
[45] Date of Patent: Dec. 22, 1998

[54] PLASTIC BODY SURFACE-MOUNTING SEMICONDUCTOR POWER DEVICE HAVING DIMENSIONAL CHARACTERISTICS OPTIMIZED FOR USE OF STANDARD SHIPPING AND TESTING MODES

[75] Inventors: Renato Poinelli, Casatenovo; Mauro Mazzola, Treviglio, both of Italy

[73] Assignee: SGS-Thomson Microelectronics S.r.l., Agrate Brianza, Italy

[21] Appl. No.: 788,014

[22] Filed: Jan. 24, 1997

[30] Foreign Application Priority Data

Jan. 25, 1996 [EP] European Pat. Off. ............ 96830030

[51] Int. Cl.$^6$ .......................... H01L 23/433; H01L 23/31
[52] U.S. Cl. .......................... 257/675; 257/678; 257/706; 257/712; 257/717; 257/720; 257/713; 257/796
[58] Field of Search ...................................... 257/675, 678, 257/706, 707, 712, 717, 720, 796, 713, 676, 666, 737, 738, 735

[56] References Cited

U.S. PATENT DOCUMENTS

| 4,681,221 | 7/1987 | Chickanosky et al. | 206/328 |
|---|---|---|---|
| 5,041,902 | 8/1991 | McShane | 257/706 |
| 5,105,259 | 4/1992 | McShane et al. | 257/667 |
| 5,157,480 | 10/1992 | McShane et al. | 257/675 |
| 5,172,213 | 12/1992 | Zimmerman | 257/675 |
| 5,198,964 | 3/1993 | Ito et al. | 257/796 |
| 5,202,288 | 4/1993 | Doering et al. | 437/209 |
| 5,216,283 | 6/1993 | Lin | 257/717 |
| 5,223,739 | 6/1993 | Katsumata et al. | 257/666 |
| 5,345,106 | 9/1994 | Doering et al. | 257/675 |
| 5,438,478 | 8/1995 | Kondo et al. | 257/706 |
| 5,445,995 | 8/1995 | Casati et al. | 257/796 |
| 5,475,259 | 12/1995 | Kasai et al. | 257/706 |
| 5,489,801 | 2/1996 | Blish, II | 257/720 |
| 5,559,306 | 9/1996 | Mahulikar | 257/659 |
| 5,565,709 | 10/1996 | Fukushima et al. | 257/788 |
| 5,583,377 | 12/1996 | Higgins, III | 257/706 |
| 5,612,576 | 3/1997 | Wilson et al. | 257/788 |
| 5,656,864 | 8/1997 | Mitsue et al. | 257/787 |

FOREIGN PATENT DOCUMENTS

| A-0 538 010 | 4/1993 | European Pat. Off. | H01L 23/31 |
|---|---|---|---|
| A-0 548 496 | 6/1993 | European Pat. Off. | H01L 21/00 |

OTHER PUBLICATIONS

European Search Report from European Patent Application 96830030.1, filed Jan. 25, 1996.

Patent Abstracts of Japan, vol. 010, No. 251 (E–432), Aug. 28, 1986 & JP–A–61 080843 (Rohm Co. Ltd.) 24 Apr. 1986.

*Primary Examiner*—Tom Thomas
*Assistant Examiner*—Alexander Oscar Williams
*Attorney, Agent, or Firm*—Wolf, Greenfield & Sacks, P.C.

[57] ABSTRACT

A QFP plastic surface-mounting semiconductor power device, comprising a plastic package inside which there is provided a chip which is connected by means of conductors to terminals that protrude from the plastic package, and a heat sink plate that is arranged on the bottom of the plastic package and has thinner ends, wherein the length of the heat sink plate is at least equal to the minimum length of the plastic package, channels being formed in the plastic package in a position that is adjacent to the thinner ends of the heat sink plate.

15 Claims, 5 Drawing Sheets

PLASTIC BODY SURFACE-MOUNTING SEMICONDUCTOR POWER DEVICE HAVING DIMENSIONAL CHARACTERISTICS OPTIMIZED FOR USE OF STANDARD SHIPPING AND TESTING MODES

BACKGROUND OF THE INVENTION

1. Field of the Invention

The present invention relates to a plastic body surface-mounting semiconductor power device having dimensional characteristics optimized for the use of standard shipping and testing modes.

More particularly, the present invention relates to a surface-mounting QFP (Quad Flat Package) semiconductor power device having optimized dimensions and to a refinement by means of which it is possible to ship said QFPs in containers normally used to transport standard QFP devices.

2. Discussion of the Related Art

Integrated circuits and other active electronic devices or components are generally conventionally constituted by a chip made of a semiconductor material and require a special configuration for their mounting on an external electric circuit. A typical configuration of this kind is the one provided by a plastic package inside which a chip is arranged; the chip is connected, by thin metal conductors, to terminals which protrude from the package and are commonly termed leads.

In integrated power circuits, which are designed to operate with high currents and are thus subject to intense heating, there is provided a small metal plate whereon the chip is mounted. This metal plate acts as a heat sink for the chip, since it transfers the heat generated during the operation of the device outside the plastic package.

FIGS. 1 to 4 illustrate a conventional semiconductor power device.

The configuration of the semiconductor power device is shown in particular in FIGS. 1 and 2, where the reference numeral 1 designates the external plastic package, the reference numeral 2 designates the heat sink provided with ends 2', and the reference numeral 3 designates the leads. The length of the heat sink is designated by L, whereas the minimum length of the plastic package 1, i.e., of its bottom, is designated by L1. The figure shows that L is greater than L1, i.e., the heat sink protrudes lengthwise from the plastic package 1, whereas as shown in FIG. 3 it is not as wide as said package 1.

In practice, the ends 2' of the heat sink 2 are exposed.

It should be noted that since the device is preset for surface-mounting, as shown in FIG. 2, the leads 3 are bent so that their free ends reach the level of the plane that contains the heat sink 2.

The power device is soldered to a printed circuit 4 by soldering the plate that constitutes the heat sink 2 and the leads 3 to preset metallic regions of said printed circuit 4.

The exposed ends 2' of the heat sink 2 allow inspection of the chamfered edge 5 of the soldering, known as the meniscus, after the power device has been soldered to the printed circuit 4, to check that the soldering is correct.

Furthermore, the exposed ends 2' of the heat sink 2 allow checking its perfect alignment with the corresponding area of the printed circuit 4.

In this regard, a process for producing the exposed ends 2' of the heat sink 2 is known which allows obtaining said ends 2' free of any plastic burr that would form both around the edges of the ends 2' and above them as a consequence of the molding of the plastic package 1 around the chip arranged on the heat sink 2.

The need to have the ends 2' of the heat sink 2 exposed and most of all free from any residual plastic burr entails the production of protruding ends 6 of the plastic package 1. These protruding ends 6 are adjacent to the lateral surface of the exposed ends 2' of the heat sink 2, as shown in FIGS. 3 and 4.

Since it is indispensable to have burr-free lateral surfaces of the exposed ends 2', and since this burr removing operation entails using a tool, the need to make the ends 2' protrude from the plastic package 1 is evident.

If the ends 2' did not protrude from said package 1, or if they were even recessed with respect thereto, the operation for eliminating the plastic burr would certainly damage the plastic package 1.

In the case being considered, with the above mentioned conventional molding process no problems arise, since the elimination of the plastic burr from the lateral surface of the exposed ends 2' consists merely in eliminating the protruding ends 6 of the plastic package 1, which are located far enough from the edges of the plastic package 1.

From the above description it is therefore evident that the exposed ends 2' of the heat sink have an important functional purpose to which, however, drawbacks are linked.

A first drawback is due to the fact that power devices having such a heat sink 2 cannot be placed in standard containers for shipping and cannot even be tested by means of electric contact pads and standard equipment.

Semiconductor devices are in fact handled and shipped in standard plastic containers, wherein however it is not possible to place semiconductor power devices provided with a heat sink, due to the exposed ends 2'.

FIG. 5 shows the insertion of a surface-mounting semiconductor power device in a container 7 for shipping. The figure shows that the exposed ends 2' of the heat sink 2 interfere with the edges of the square hollow 8 provided for accommodating the device inside the standard plastic container 7.

A second drawback shown in FIGS. 6, 7a, and 7b arises from the observation that since the heat sink 2 is narrower than the plastic package 1 along its width and has exposed ends 2', the only point of contact with the square hollow 8 of the plastic container 7 is indeed at said exposed ends 2'. In this manner, as shown in FIG. 7b, the positioning of the power device inside the square hollow 8 is not stable enough, making its shipping unreliable.

A principal aim of the present invention is therefore to provide a surface-mounting semiconductor power device having dimensional characteristics that are optimized for the use of standard shipping and testing modes.

Within the scope of this aim, an object of the present invention is to provide a surface-mounting semiconductor power device with a heat sink that is shorter than conventional embodiments while preserving their advantages.

Another object of the present invention is to provide a surface-mounting semiconductor power device that can be stably placed on the container for shipping.

Another object of the present invention is to provide a surface-mounting semiconductor power device that is highly reliable and relatively easy to manufacture at competitive costs.

SUMMARY OF THE INVENTION

This aim, these objects, and others which will become apparent hereinafter are achieved by a QFP plastic surface-mounting semiconductor power device, which comprises a plastic package inside which there is provided a chip which is connected by means of conductors to terminals that protrude from said plastic package, and a heat sink plate that is arranged on the bottom of said plastic package and has thinner ends, wherein the length of said heat sink plate is at least equal to the minimum length of said plastic package, channels being formed in said plastic package in a position that is adjacent to the thinner ends of said heat sink plate.

BRIEF DESCRIPTION OF THE DRAWINGS

Further characteristics and advantages of the invention will become apparent from the description of a preferred but not exclusive embodiment of the device according to the invention, illustrated only by way of non-limitative example in the accompanying drawings, wherein:

FIG. 12 is a detail view of a portion of FIG. 11a.

In all the different figures, identical reference numerals designate identical components.

DETAILED DESCRIPTION

Figure 8:
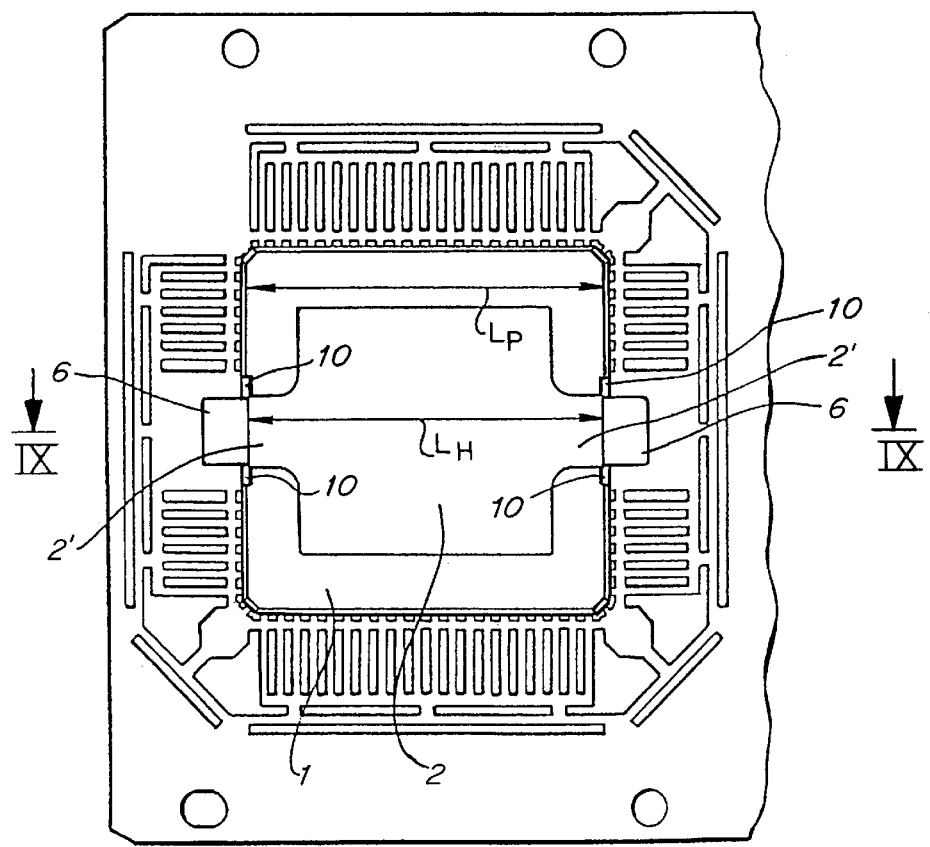
FIG. 8 is a bottom view of the device according to the invention, arranged on the corresponding supporting frame.
Figure 9:
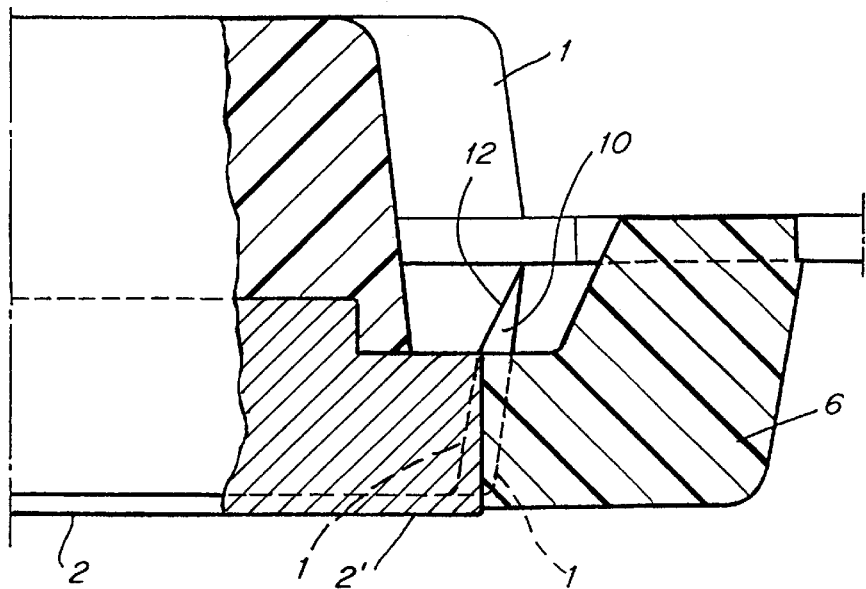
FIG. 9 is a partial sectional view of the device according to the invention, taken along the plane IX—IX of FIG. 8.
Figure 10:
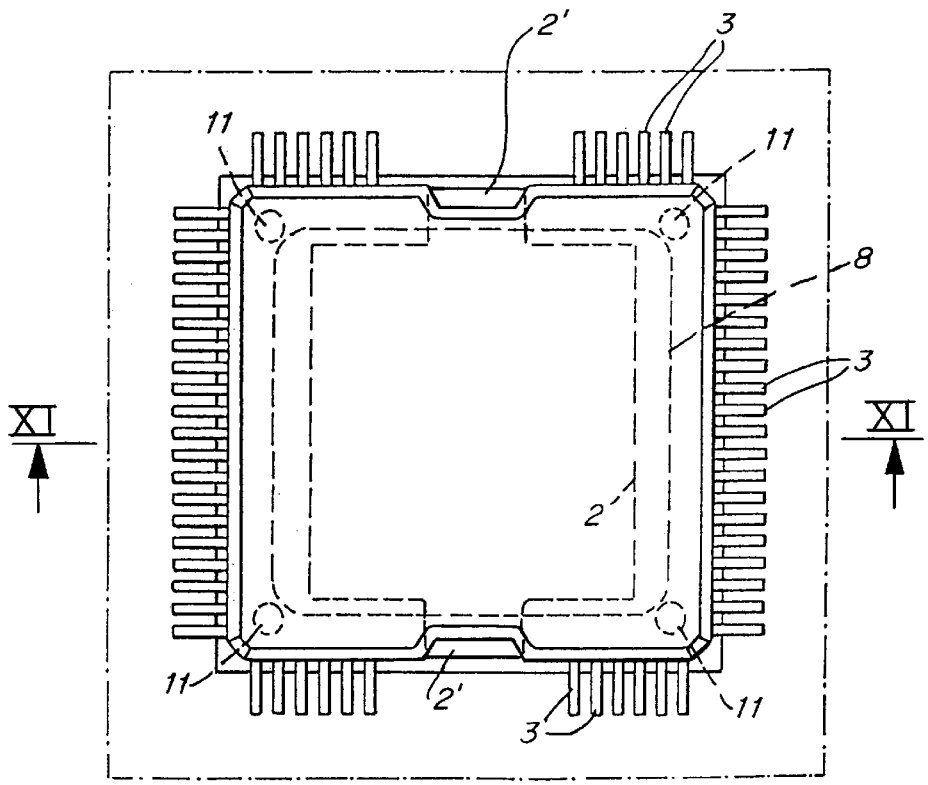
FIG. 10 is a plan view of the device according to the invention.

With reference to FIGS. 8 and 9, the surface-mounting QFP semiconductor power device according to the invention comprises a plastic package 1, inside which the chip (not shown) is placed, and a heat sink that is formed by a metal plate 2 whereon the chip is placed.

The overall length $L_H$ of the heat sink 2 is less than, or at the most equal to, the minimum dimension $L_P$ of the plastic package 1.

At the regions of the plastic package 1, directly adjacent to each end 2' of the heat sink 2, two channels 10 are provided which are shaped as shown in FIG. 9.

Four channels 10 are thus provided, two for each side of the plastic package, which are arranged at the ends 2' of the heat sink 2 and are closely adjacent to said ends.

As shown in FIG. 9, the plastic package 1 protrudes with respect to the ends 2' of the heat sink 2 except at the regions adjacent to said ends 2', where the channels 10 are formed.

Each channel 10 is formed by producing a hollow in the plastic package 1 that has a profile similar to the profile normally assumed by said plastic package 1, with the particularity that it has an inclined surface 12 that blends, in an upward region, with the normal profile of the package 1.

In this manner it is possible to reduce the length of the heat sink 2 to the length of the plastic package 1, indeed by virtue of the presence of the four channels 10.

At the four channels 10, the ends 2' of the heat sink 2 are in fact again exposed, as explained above, with the consequent advantage that it is possible to remove the protruding ends 6 of the plastic package 1 without damaging said package and to inspect the correctness of the soldering performed between the heat sink and the printed circuit whereon the QFP power device is surface-mounted.

Outside the four channels 10, instead, the length $L_H$ of the heat sink is at least equal to, or smaller than (depending on the manufacturing choice that is made) the minimum length $L_H$ of the plastic package 1.

Therefore, the reduction in the length of the heat sink 2 with respect to conventional solutions is combined with a local reduction (i.e., at the four channels 10) of the minimum length of the plastic package 1.

An effect thereof is that it is possible to use, for the shipping of QFP power devices, standard containers 7 that are normally used to ship standard QFP devices, i.e., devices that do not have the heat sink 2. The reduction in the length of the heat sink 2 to the length of the plastic package 1 eliminates the interference between the ends 2' of the heat sink and the walls of the hollow 8 of the container 7 preset to accommodate said QFP power device.

Furthermore, with reference to FIGS. 10, 11a, 11b, and 12, the bottom surface of the plastic package 1 is provided, at its four corners, with four resting elements advantageously having a circular shape.

These resting elements 11 allow the QFP power device to rest more stably inside the hollow 8 of the container 7 than would occur if the device rested exclusively on the ends 2' of the heat sink.

Figure 12:
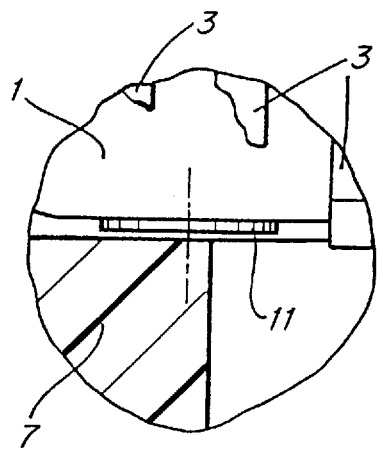

The thickness of the resting elements 11 is in any case smaller than the thickness of the heat sink 2 which-protrudes from the bottom of the plastic package 1 (see the detail shown in FIG. 12).

Figure 1:
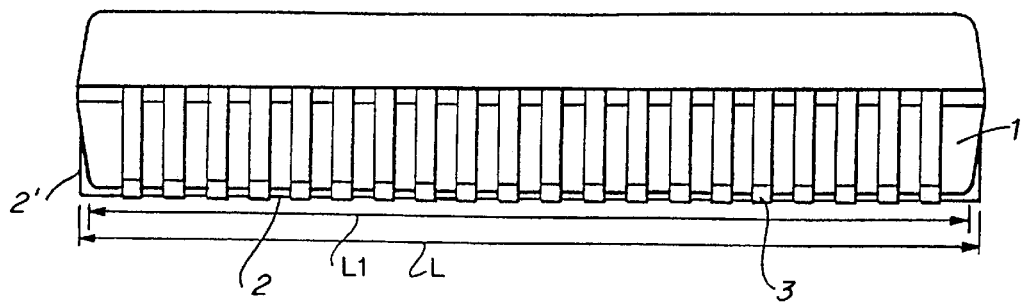
FIG. 1 is a side view of a conventional plastic body surface-mounting semiconductor power device.
Figure 2:
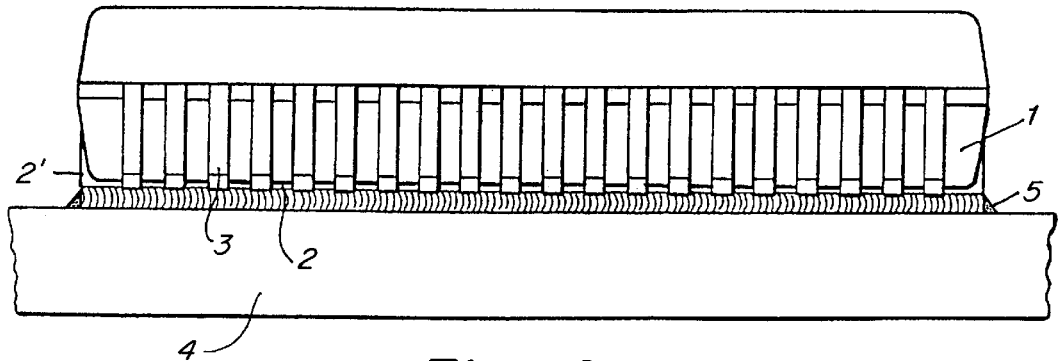
FIG. 2 is a side view of the semiconductor device of FIG. 1, soldered to a printed circuit.
Figure 3:
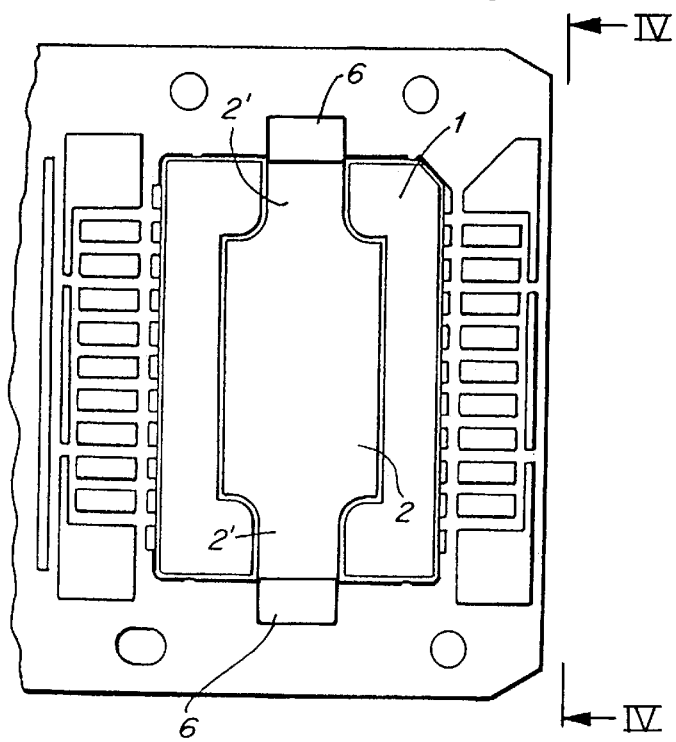
FIG. 3 is a plan of the device of FIG. 1, with the corresponding supporting frame.
Figure 4:
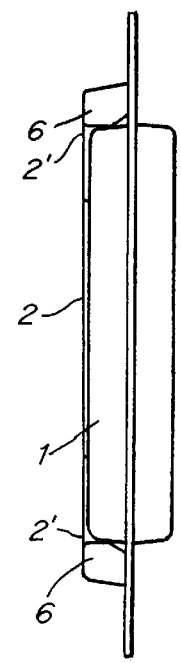
FIG. 4 is a side view, taken along the plane IV—IV, of the device shown in FIG. 3.
Figure 5:
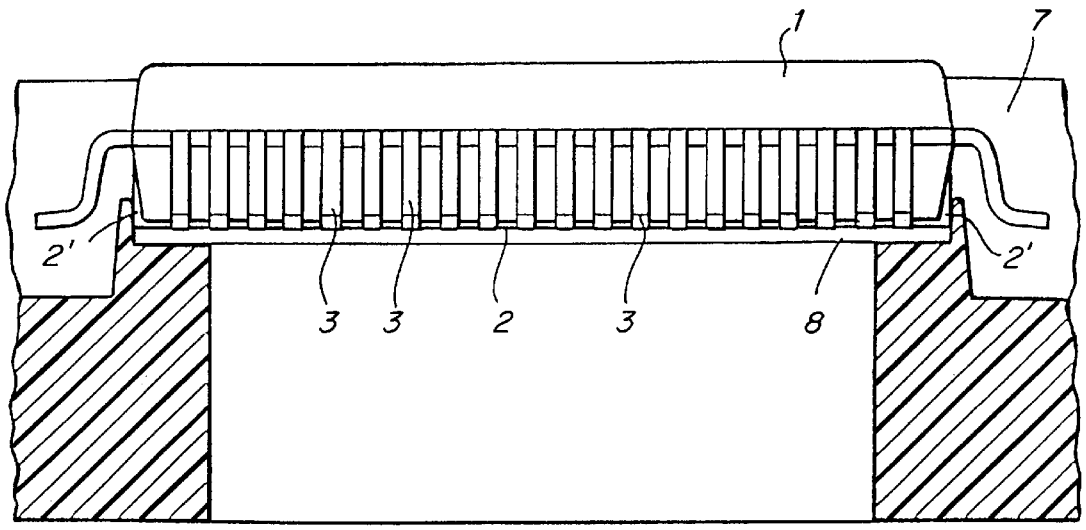
FIG. 5 is a sectional side view, illustrating the conventional device shown in FIG. 1 inserted in a container shipping.
Figure 6:
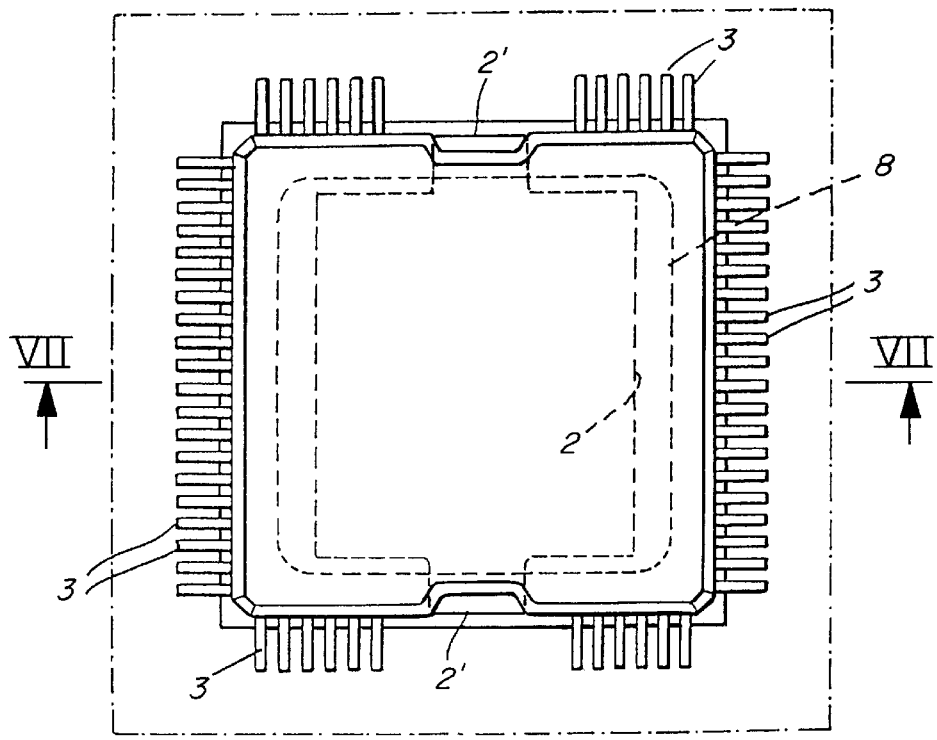
FIG. 6 is a plan view of the conventional device inserted in the container for shipping.
Figure 7A:
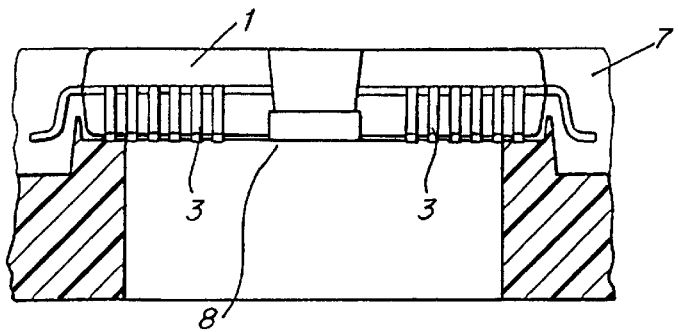
FIG. 7a is a partially sectional view of the conventional device, taken along the plane VII—VII of FIG. 6.
Figure 7B:
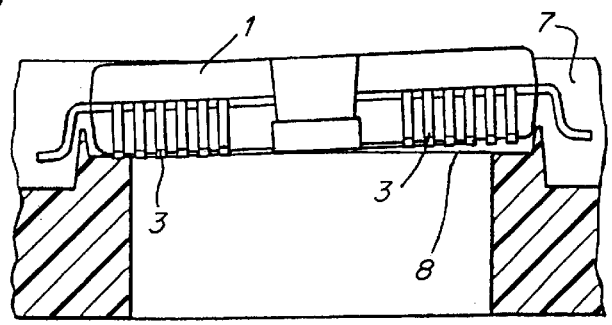
FIG. 7b is a partially sectional view of the conventional device, taken along the plane VII—VII of FIG. 6.
Figure 11A:
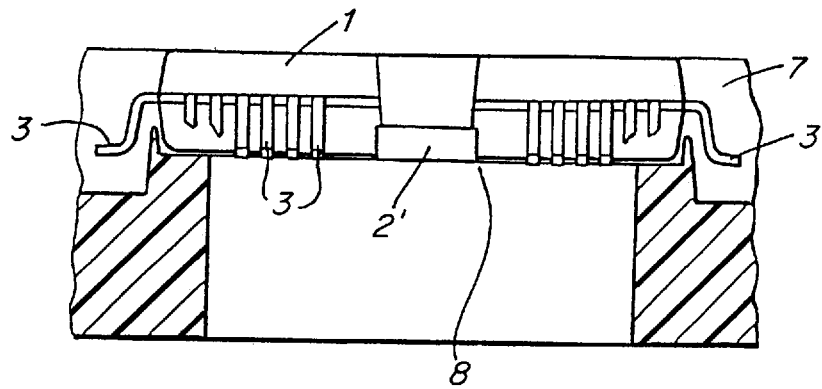
FIG. 11a is a partial sectional view, taken along the plane XI—XI of FIG. 10.
Figure 11B:
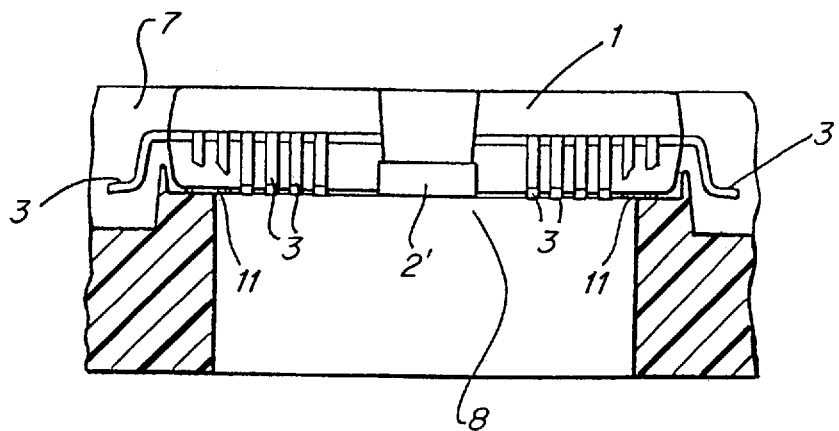
FIG. 11b is a partial sectional view, taken along the plane XI—XI of FIG. 10.

In this manner, the power device always rests mainly on the ends 2' of the heat sink 2, with the aid of additional resting points at the four corners of the plastic package 1 that considerably improve the stability of the behavior of the device accommodated in the hollow 8 with respect to what normally occurs with devices having a conventional configuration. FIG. 11b shows the stable, tilt-free behavior of the QFP power device accommodated in the hollow 8 in comparison with the behavior shown in FIG. 7b.

In practice it has been observed that the device according to the invention fully achieves the intended aim, since it allows a reduction in the length of the heat sink, eliminating the above mentioned shipping drawbacks, without at the same time losing the advantages arising from the fact that the ends 2' of the heat sink 2 are exposed.

Furthermore, the four resting elements 11 placed at the four corners of the plastic package 1 help to improve the shipping stability of the device.

The device thus conceived is susceptible of numerous modifications and variations, all of which are within the scope of the inventive concept; all the details may furthermore be replaced with other technically equivalent elements.

Thus, for example, the channels 10 and the resting elements 11 can of course also be provided on standard QFP devices if particular shipping and testing requirements suggest their use. Finally, it is also evident that the shape of the resting elements 11 can be altered at will without affecting their functionality in any way.

In practice, the materials employed, so long as they are compatible with the specific use, as well as the dimensions, may be any according to the requirements and the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A QFP plastic surface-mounting semiconductor power device, comprising
    a plastic package inside which there is provided a chip which is connected by means of conductors to terminals that protrude from said plastic package, and a heat sink plate that is arranged on the bottom of said plastic package and has thinner ends, wherein a length of said heat sink plate is at most equal to a minimum length of said plastic package, channels being formed in said plastic package in a position that is adjacent to the thinner ends of said heat sink plate, wherein each of said channels includes two opposing channels that are adjacent to side edges of each one of the ends of said heat sink plate and inside said plastic package, said channels being adapted to allow the exposure of each one of said ends from said plastic package to avoid damage during the finishing of said power device.

2. The device according to claim 1, wherein the length of said heat sink plate is less than the minimum length of said plastic package.

3. The device according to claim 1, wherein each one of said channels formed inside said plastic package has a profile that duplicates the profile of the region of said plastic package outside said channels, the upper region of each one of said channels being blended, by an inclined flat surface, with the profile of the region of said plastic package that lies outside said channels.

4. The device according to claim 1, further comprising a plurality of resting elements that are arranged on the bottom region of said plastic package and are adapted to allow stable resting inside containers provided for the shipping of said power device.

5. The device according to claim 4, wherein the plurality of resting elements comprises four resting elements arranged at the four corners of said plastic package.

6. The device according to claim 5, wherein each one of said resting elements is thinner than said heat sink plate placed on the bottom of said plastic package.

7. The device according to claim 6, wherein each one of said resting elements has a circular shape.

8. A surface-mount semiconductor device, comprising:
    a plastic package including a top surface, a bottom surface and angled sides connecting the top and bottom surfaces, said package having channels disposed on opposing sides of said package, said package having a minimum length between the opposing sides along the bottom surface and a maximum length between the opposing sides intermediate the top and bottom surfaces;
    a heat sink plate that is arranged on the bottom surface of said package, said heat sink plate including a central portion and end portions extending from opposite sides of said central portion, said end portions being narrower than said central portion and disposed adjacent said channels so that said end portions are exposed, said heat sink plate having a length that is at most equal to the minimum length of said plastic package;
    a plurality of surface-mount terminals protruding from said package; and
    a chip disposed within said package and electrically connected to said terminals, said chip being mounted to said heat sink plate.

9. The device according to claim 8, wherein the length of said heat sink plate is less than the minimum length of said plastic package.

10. The device according to claim 8, wherein said channels include two opposing channels that are adjacent side edges of each end portion of said heat sink plate, said channels being adapted to expose each of said end portions to avoid damage to said package during the finishing process of said power device.

11. The device according to claim 10, wherein each of said opposing channels has a profile that duplicates the profile of said sides of said plastic package adjacent said channels, each of said opposing channels having an upper region that is blended, by an inclined flat surface, with the profile of the sides of said plastic package.

12. A surface-mount semiconductor device, comprising:
    a plastic package including a top surface, a bottom surface and sides connecting the top and bottom surfaces, said package having channels disposed on opposing sides of said package;
    a heat sink plate that is arranged on the bottom surface of said package, said heat sink plate including a central portion and end portions extending from opposite sides of said central portion, said end portions being narrower than said central portion and disposed adjacent said channels so that said end portions are exposed;
    a plurality of resting elements that protrude from the bottom surface of said plastic package and are configured to stabilize said package when placed inside a container for shipping said device;
    a plurality of surface-mount terminals protruding from the sides of said package; and
    a chip disposed within said package and electrically connected to said terminals, said chip being mounted to said heat sink plate.

13. The device according to claim 12, wherein the plurality of resting elements includes four resting elements arranged at the four corners of said package.

14. The device according to claim 12, wherein said heat sink plate and each resting element protrudes from the bottom surface of said package, said resting elements protruding from the bottom surface of said package by an amount that is less than said heat sink plate.

15. The device according to claim 12, wherein each resting element has a circular shape.

* * * * *